US012794215B2

(12) United States Patent
Horanzy et al.

(10) Patent No.: US 12,794,215 B2
(45) Date of Patent: Nov. 10, 2026

(54) GROUND FAULT CIRCUIT INTERRUPTER (GFCI) WITH LIMIT DETECTION AND ADAPTIVE SAMPLE ACCUMULATION WINDOW

(71) Applicant: Cypress Semiconductor Corporation, San Jose, CA (US)

(72) Inventors: Joseph Horanzy, Huntington Valley, PA (US); Nidhin Mulangattil Sudhakaran, Unterhaching (DE)

(73) Assignee: Infineon Technologies Americas Corp., El Segundo, CA (US)

(*) Notice: Subject to any disclaimer, the term of this patent is extended or adjusted under 35 U.S.C. 154(b) by 223 days.

(21) Appl. No.: 18/891,375

(22) Filed: Sep. 20, 2024

(65) Prior Publication Data

US 2025/0316975 A1 Oct. 9, 2025

Related U.S. Application Data

(60) Provisional application No. 63/631,894, filed on Apr. 9, 2024.

(51) Int. Cl.

| | |
|---|---|
| ***H02H 3/16*** | (2006.01) |
| ***G01R 31/52*** | (2020.01) |
| ***H02H 3/33*** | (2006.01) |

(52) U.S. Cl.

CPC ............. *H02H 3/162* (2013.01); *G01R 31/52* (2020.01); *H02H 3/331* (2013.01)

(58) Field of Classification Search

CPC ...... H02H 3/162; H02H 3/331; H02H 1/0092; G01R 31/52

USPC ........................................................... 361/42

See application file for complete search history.

(56) References Cited

U.S. PATENT DOCUMENTS

| | | | | |
|---|---|---|---|---|
| 5,627,718 A * | 5/1997 | Engel | G01R 21/133 | 324/120 |
| 11,721,508 B2 * | 8/2023 | Telefus | G01R 31/3277 | 361/42 |
| 2010/0091419 A1 * | 4/2010 | Vedula | H02H 3/353 | 361/47 |
| 2011/0216453 A1 * | 9/2011 | Haines | H02H 9/00 | 361/49 |
| 2012/0098672 A1 * | 4/2012 | Restrepo | H02H 1/0015 | 340/815.45 |
| 2014/0233144 A1 * | 8/2014 | Seon | G01R 19/02 | 327/348 |
| 2019/0182589 A1 * | 6/2019 | Palit | H03F 3/187 | |

(Continued)

*Primary Examiner* — Dharti H Patel

(57) ABSTRACT

An integrated circuit includes front-end circuitry coupled to a current sensor, which is coupled to alternating current (AC) mains, and to convert a leakage current to a converted voltage. An analog-to-digital converter (ADC), coupled to the front-end circuitry, converts the converted voltage to a digital signal. The ADC includes limit detection circuitry to detect the digital signal indicating the converted voltage is lower than a low threshold limit or higher than a high threshold limit and output a limit interrupt in response to the detection. Control logic is coupled to an output of the ADC and to process, in response to receiving the limit interrupt, the digital signal to determine a root mean square (RMS) value, and output a trip signal to trip logic to cause a disconnect of a current supplied to a load by the AC mains in response to the RMS value satisfying a threshold trip value.

20 Claims, 9 Drawing Sheets

(56) References Cited

U.S. PATENT DOCUMENTS

| | | | | |
|---|---|---|---|---|
| 2022/0140592 | A1* | 5/2022 | Rivers | G01R 15/183 361/42 |
| 2022/0311234 | A1* | 9/2022 | Rivers | H02H 3/32 |
| 2024/0097429 | A1* | 3/2024 | Singh | H02H 5/12 |
| 2024/0120725 | A1* | 4/2024 | Hurwitz | G01R 31/52 |
| 2024/0178653 | A1* | 5/2024 | Telefus | H02H 3/32 |
| 2025/0316972 | A1* | 10/2025 | Horanzy | H02H 3/021 |
| 2025/0316975 | A1* | 10/2025 | Horanzy | H02H 3/162 |

* cited by examiner

GROUND FAULT CIRCUIT INTERRUPTER (GFCI) WITH LIMIT DETECTION AND ADAPTIVE SAMPLE ACCUMULATION WINDOW

REFERENCE TO EARLIER FILED APPLICATION

This application claims the benefit under 35 U.S.C. § 119(e) of U.S. Provisional Patent Application No. 63/631,894, filed Apr. 9, 2024, which is incorporated herein, in its entirety, by this reference.

BACKGROUND

A ground fault circuit interrupter (GFCI) product or device operates by continuously monitoring the current flow in a sensing circuit. The current flow being monitored is often alternating-current (AC) from power mains. The GFCI device compares the current flowing into a sensing circuit (through a hot wire) with the current flowing out of the sensing circuit (through a neutral wire). Under normal conditions, these currents are equal.

The GFCI device may contain a current transformer or solid state switch with both the hot (or live) wire and the neutral wire passing through the same coil. When there is mismatch in amplitude and/or the phase angle is not 180 degrees between the hot and neutral wires, the current transformer or solid state switch becomes unbalanced due to a leakage of current to the ground, which the current transformer or solid state switch can detect. If the difference exceeds a certain threshold (typically 4-6 milliamps), the sensing circuit triggers a response. In response to exceeding the threshold current, the sensing circuit activates a switch or solenoid that quickly disconnects the power supply to the sensing circuit, stopping the flow of electricity. After tripping, the GFCI device is manually reset to restore power, ensuring the fault is corrected before the sensing circuit can be used again.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
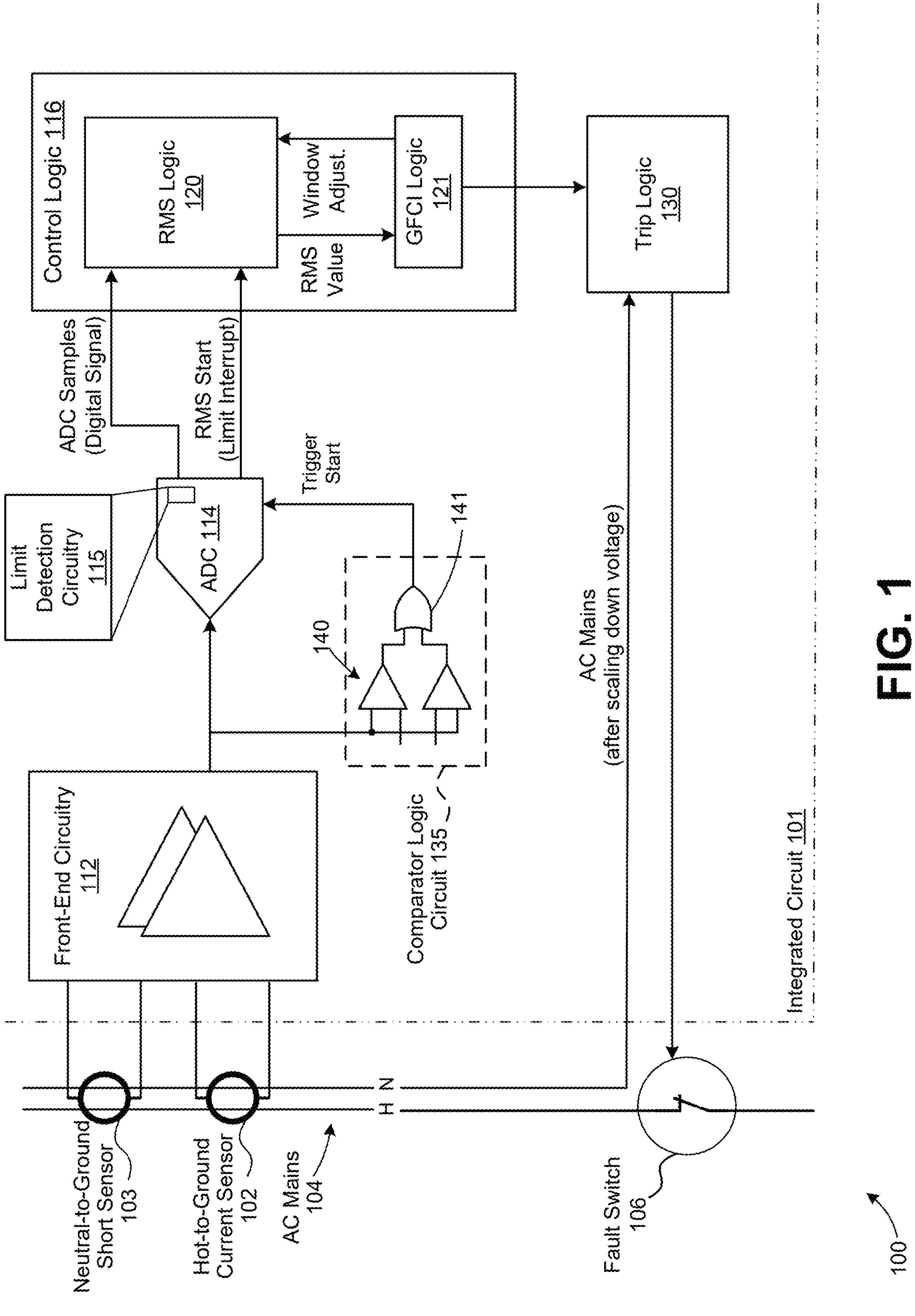
FIG. 1 is a schematic diagram of a GFCI system in which sensing circuitry is implemented within an integrated circuit, to include limit detection and adaptive sample accumulation configured to determine if and when to disconnect current (e.g., power) flowing to a load according to some embodiments.

The following description sets forth numerous specific details such as examples of specific systems, components, methods, and so forth, in order to provide a good understanding of various embodiments of an integrated circuit configured to perform integrated ground fault detection and power interruption described herein. Such integrated circuits may be implemented within GFCI products or devices in various disclosed embodiments. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to “an embodiment,” “one embodiment,” “an example embodiment,” “some embodiments,” and “various embodiments” means that a particular feature, structure, step, operation, or characteristic described in connection with the embodiment(s) is included in at least one embodiment. Further, the appearances of the phrases “an embodiment,” “one embodiment,” “an example embodiment,” “some embodiments,” and “various embodiments” in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as “examples,” are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Certain ground fault circuit interrupter (GFCI) products on the market today are designed with a two-chip solution that includes an analog front end providing GFCI functionality and a microcontroller that executes safety functions to comply with the UL-943 specification, e.g., so that the GFCI products can be considered Class A devices. For example, the microcontroller is externally coupled to a GFCI analog device for purposes of performing self tests to conform with UL-943. This two-chip approach takes up printed circuit board (PCB) real estate, uses more components, and reduces reliability.

Further, many present GFCI designs employ hard-coded, arbitrary threshold values to determine when the circuit should trip open, e.g., interrupt or disconnect a load from alternating current (AC) power, during a current leakage event. If the sensing circuitry fails, present GFCI products have no contingency or backup circuit for protection that the GFCI product should provide. Further, in present GFCIs, false trips occur regularly due to lack of signal conditioning or filtering. In some cases, false nuisance trips cause end users to replace the GFCI device with a standard outlet, which is a less-safe, certainly non-ideal, solution.

Additionally, because present GFCI products are implemented in application-specific integrated circuit(s) (ASICs) or hardware, functionality cannot be altered after manufacturing. A new revision of the entire GFCI product or device would need to be implemented, which would cause delays in manufacturing and increase costs. Present GFCI products such as GFCI outlets tend to use fixed delays to trigger a trip of the power, rather than more-preferable variable trip delay based on a root mean square (RMS) value of the leakage current.

Further, continuous RMS calculation of sensed voltage required to calculate a true RMS value requires the use of large buffers and is memory and compute intensive. Continuous true RMS-based calculation also requires more power than the tiny, inexpensive capacitive or resistive power supplies typically found in GFCI outlets are capable of supplying. Moving RMS and window-based RMS methods, as alternatives to true RMS calculations, are slow and produce ripples. Thus, the more-desired, true RMS-based GFCI outlets are cost prohibitive for devices that intentionally employ inexpensive microcontrollers for cost purposes. For example, the memory, processing, and power required to implement true RMS-based methods have generally been incompatible with such inexpensive microcontrollers.

Aspects and embodiments of the present disclosure overcome the above-mentioned and other deficiencies by integrating sensing circuitry on an integrated circuit (IC) with control logic in a way that intelligently monitors for leakage current from AC mains and selectively triggers or activates certain components of the signal and analysis processing chain based on a magnitude of a corresponding or converted voltage. In this way, the disclosed GFCI device or system can calculate true RMS values while conserving processing, memory, and power sufficiently so as to be implementable within such inexpensive microcontrollers.

For example, in some embodiments, the disclosed GFCI device or system includes front-end circuitry coupled to a current sensor that is coupled to AC mains, which are being monitored for leakage current. This front-end circuitry can condition or otherwise convert the leakage current to a converted voltage that can then be converted into a digitized signal for RMS calculation. In various embodiments, RMS is a statistical measure of the magnitude of a varying quantity, in this case, a converted voltage. Root mean square (RMS) can be calculated by squaring the instantaneous values of the voltage, averaging these squared values over one cycle, and then taking the square root of this average. For a sinusoidal AC current expressed as $$I(t) = I_{peak}\sin(\omega t), \tag{1}$$

the RMS value can be given by:

$$I_{RMS} = \frac{I_{peak}}{\sqrt{2}}. \tag{2}$$

An RMS value provides a measure of the equivalent DC current that would deliver the same power to a resistive load as the AC current or voltage. Accordingly, an RMS value is always positive and is a more meaningful representation of the AC current's ability to perform work (i.e., deliver power).

In some embodiments, an analog-to-digital converter (ADC) can detect that a converted voltage (e.g., as indicated by a digital signal output by the ADC) is outside of a window of threshold limits, e.g., limit window. In embodiments, based on this detection, the ADC generates a limit interrupt (or trigger) to control logic that otherwise remains inactive. For example, the limit window can be defined by a low threshold limit and a high threshold limit, which also can provide a precise starting point for RMS algorithms, eliminating a need to use large buffers for the incoming digital signal. In some embodiments, comparator logic circuit is also coupled between the front-end circuitry and the ADC and is to trigger a start of the ADC in response to detecting that the converted voltage satisfies a threshold value, e.g., a threshold voltage, further reducing the power consumption by allowing the ADC to sleep longer.

In such embodiments, in response to the limit interrupt received from the ADC, the control logic is triggered to begin processing a digital signal received from the ADC to determine an RMS value corresponding to the converted voltage. If the RMS value satisfies a threshold trip value, the control logic can then output a trip signal to trip logic, causing a disconnect of a current supplied to a load by AC mains. The control logic can further be configured to accept and process ADC samples during a particular time period that is a fixed period of time based on a frequency of a waveform of the AC mains. In this way, the control logic can remain inactive (or asleep) when not processing the digital signal representing the converted voltage and limit the processing period when processing the digital signal, enabling a significant power consumption savings.

Further, in some embodiments, if the RMS value does not satisfy the threshold trip value but does satisfy a minimum threshold value, the control logic increases the size of an RMS time window to trigger additional accumulation of ADC samples used in determining the RMS value. In this way, a delay is imposed during which a more accurate RMS value is computed, e.g., approaching a true RMS value. Thus, any decision to issue the trip signal can be based on a more accurate RMS value. This built-in delay can also avoid prematurely tripping a disconnect from power based on short variations in current that would otherwise cause a GFCI device, which employs a fixed threshold value, to trip.

Advantages of the present disclosure include but are not limited to producing a GFCI product or device that is highly programmable for system enhancement and future requirements changes all while reducing part count and increasing system reliability. These enhancements include the ability to deploy less-expensive DC power supply circuitry while keeping components inactive when not needed for sensing, thus obviating the need for more expensive power supply design. Additionally, the front-end circuitry and digital processing (performed by the control logic on the digitized voltage signal) can provide proper filtering, to include RMS time window size adjustments, before causing triggering. In this way, the GFCI product or device avoids causing nuisance trips, yet provides more-accurate RMS calculations. Further, the ability to calculate real-time RMS (or other type of equivalent DC) current values enables handling variable trip delays depending on the actual leakage current, which works further to avoid nuisance trips. Other advantages will be apparent to those skilled in the art of GFCI-based design discussed hereinafter.

FIG. 1 is a schematic diagram of a ground fault circuit interrupter (GFCI) system 100 in which sensing circuitry is implemented within an integrated circuit 101, to include limit detection and adaptive sample accumulation configured to determine if and when to disconnect current (e.g., power) flowing to a load according to some embodiments. In embodiments, the GFCI system 100 (which can be a GFCI product or device) includes AC mains 104 that powers a load (not illustrated) and a pair of transducers, including a hot-to-ground (H/G) current sensor 102 coupled to the AC mains 104 and a neutral-to-ground (N/G) short sensor 103 also coupled to the AC mains 104. The current sensor 102 and/or the N/G short sensor 103 can be, for example, a coil, a Hall-effect sensor, a tunneling magnetoresistance (TMR) sensor, or the like. A fault switch 106 can be coupled to the AC mains 104 and be configured to close in response a trip command from the integrated circuit 101, e.g., to disconnect the current or power from the hot line (and potentially also the neural line) of the AC mains 104 in the case of a sufficiently high leakage current (whether a H/G or N/G leakage current), as will be discussed. In some embodiments, the fault switch 106 is an electromechanical switch such as a solenoid or relay or is a solid state switch.

In various embodiments, the integrated circuit 101 portion of the GFCI system 100 includes front-end circuitry 112, an ADC 114 coupled to the front-end circuitry 112, trip logic 130, and control logic 116 coupled between the ADC 114 and the trip logic 130. In embodiments, the trip logic 130 is further coupled to the fault switch 106. In differing embodiments, the front-end circuitry 112 includes one or more of a transimpedance amplifier (TIA), active signal filtering circuitry, an amplifier, an oscillator, or the like, and configured to convert a leakage current, received from the current sensor 102, to a converted voltage. An example of the front-end circuitry 112 will be discussed with reference to FIG. 9. In embodiments, the N/G short sensor 103 is a coupling coil that couples an oscillator of the front-end circuitry 112 to the current sensor 102 to enable sensing a neutral-to-ground short.

In some embodiments, the ADC 114 converts the converted voltage to a digital signal, e.g., by sampling the converted voltage signal. The ADC 114 can include limit detection circuitry 115 to detect the digital signal indicating the converted voltage is lower than a low threshold limit or higher than a high threshold limit, e.g., outside of a window size of the low and high threshold limits. In response to being outside of ADC-based limits (e.g., power-saving limits), the limit detection circuitry 115 can output (or cause the ADC 114 to output) a limit interrupt in response to the detection. The limit interrupt can be provided to RMS logic 120 of the control logic 116. In some embodiments, the RMS logic 120 processes, in response to receiving the limit interrupt, the digital signal to determine an RMS value, which is provided to GFCI logic 121 of the control logic 116. The GFCI logic 121 can then output a trip signal to the trip logic 130 to cause a disconnect of a current supplied to the load by the AC mains 104 in response to the RMS value satisfying a threshold trip value. Additional functionality of the control logic 116 will be discussed with reference to FIGS. 2-8, discussion of which will be with additional reference to FIG. 1.

In some embodiments, the GFCI-based integrated circuit 101 (or device) further includes an optional comparator logic circuit 135 coupled between the front-end circuitry 112 and the ADC 114. In embodiments, the comparator logic circuit 135 is to trigger a start of the ADC 114 in response to detecting that the converted voltage satisfies a threshold value. The comparator logic circuit 135 can include, for example, a pair of comparators 140 that check the converted voltage against two different reference voltages (e.g., low and high threshold voltages) and an OR gate 141 (or other programmable logic) having inputs that are outputs of the pair of comparators 140. When the optional comparator logic circuit 135 is employed, the ADC 114 is turned on only when the pair of comparators 140 produce a trigger, which is intended to save power.

In at least some embodiments, the trip logic 130 is coupled to a fault switch 106 and to the AC mains 104, e.g., where the fault switch 106 is a high-voltage fault switch such as a silicon-controlled rectifier (SCR) or a power transistor. In such embodiments, the trip logic 130 compares the current of the AC mains 104 to a minimum voltage during a positive half cycle of the current. The minimum voltage can be required to trip a solenoid coupled between the AC mains 104 and the fault switch 106. In embodiments, the trip logic 130 causes the fault switch to close in response to the current exceeding the minimum voltage and in response to the trip signal. In this way, the current from the AC mains is sufficiently large to trip the solenoid (see also FIG. 9).

In other embodiments, the fault switch 106 is a low-voltage solid state switch or relay (SSR) such as a metal-oxide semiconductor field transistor (MOSFET) that does not include a coil. In such embodiments, the trip logic 130 detects a zero current crossing of the current of the AC mains 104 and causes the solid state switch to open in response to detecting the zero current crossing. In this way, the low-voltage fault switch 106 is switched at a lowest possible voltage point of the AC supply.

Figure 2:
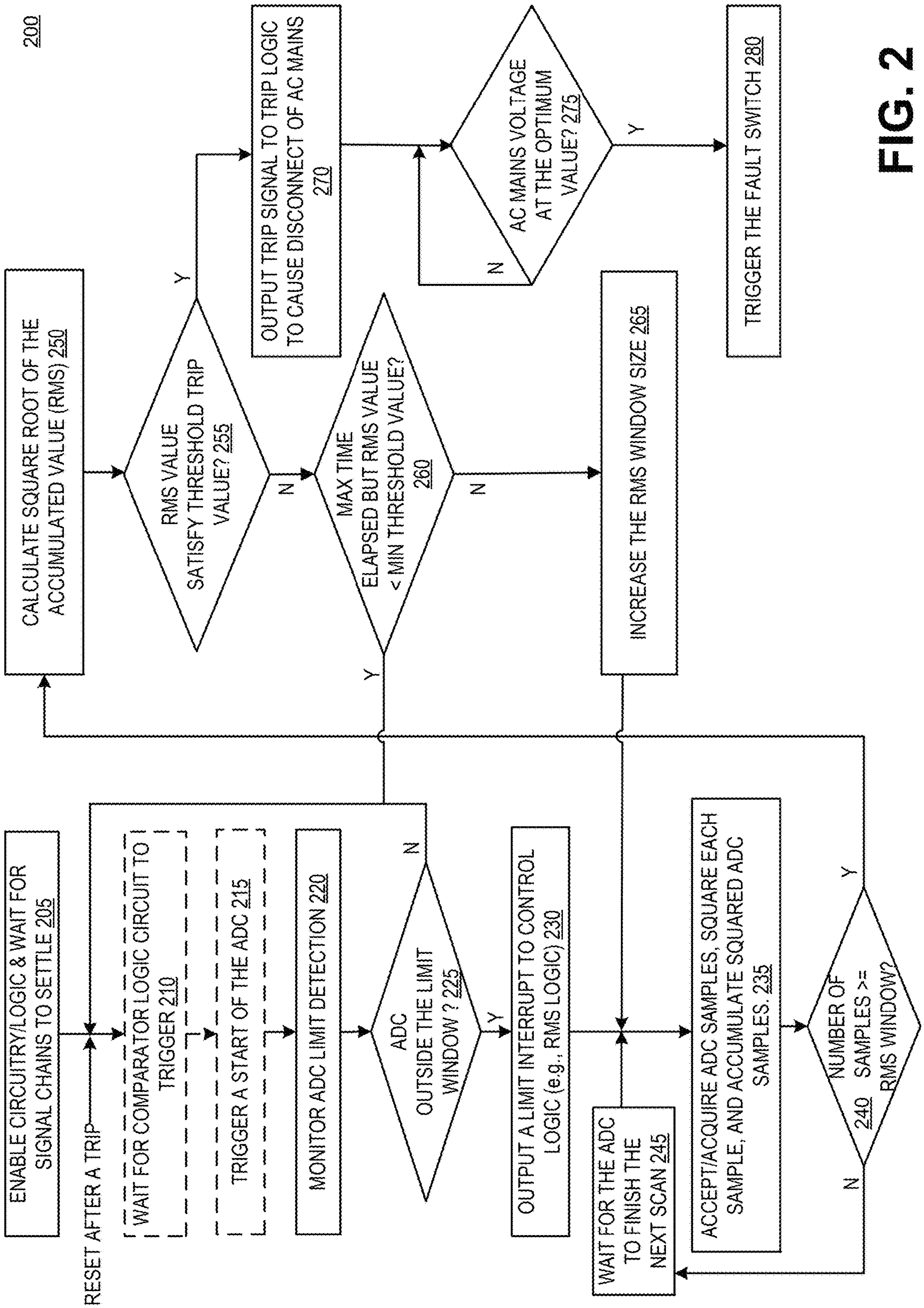
FIG. 2 is a flow chart of an example method associated with FIG. 1 that detects limits to determine when and for how long to accumulate analog-to-digital (ADC) samples as well as variably changes a root mean squared (RMS) accumulation window according to some embodiments.

FIG. 2 is a flow chart of an example method 200 associated with FIG. 1 that detects limits to determine when and for how long to accumulate analog-to-digital (ADC) samples as well as variably changes a root mean squared (RMS) accumulation window according to some embodiments. The method 200 can be performed by the integrated circuit 101 discussed with reference to FIG. 1 to include processing logic (such as the control logic 116) that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 205, the method 200 includes enabling circuitry and the control logic 116 and waiting for signal chains to settle, e.g., provide some delay after start up before employing the integrated circuit 101 to perform the method 200.

At operation 210, the processing logic optionally waits for the comparator logic circuit 135 to trigger, thus enabling both the ADC 114 and the control logic 116 to remain inactive in the absence of a sufficiently large converted voltage from the front-end circuitry 112. Again, employing these limit-based checks can significantly save power by keeping components of the integrated circuit 101 inactive unless needed to sense a potential trip-causing current leak. If the GFCI-based integrated circuit 101 is to trip, after a reset of the device, the method 200 can return to operation 210.

At operation 215, the ADC 114 is triggered into operation by the comparator logic circuit 135, as was just discussed.

At operation 220, the ADC 114 monitors the limit detection circuitry 115.

At operation 225, the ADC 114 determines whether the digital signal being generated is indicative of the converted voltage being outside of a limit window, e.g., that the converted voltage is lower than a low threshold limit or higher than a high threshold limit that is higher than the low threshold limit. If, at operation 225, the ADC 114 determines that the converted voltage is not outside of the limit window, the method 200 loops back to operation 210. In this way, the processing logic (e.g., control logic 116) remains inactive while not receiving the limit interrupt, conserving power.

At operation 230, in response to determining that the converted voltage is outside of the limit window (in operation 225), the ADC 114 outputs a limit interrupt to the processing logic. Also, in connection with operation 230, the ADC 114 can generate the ADC samples and return to an inactive state in between generating each ADC sample. The ADC 114 can further continue generating the ADC samples for a fixed period of time based on a frequency of a waveform of the AC mains 104, for example. By configuring the ADC 114 to govern or limit ON-time of the ADC 114 in this way, additional power can be conserved.

At operation 235, in response to receiving or detecting the limit interrupt (in operation 230), the processing logic begins to accept ADC samples, from the ADC 114, within the digital signal. The processing logic can also calculate a square of each ADC sample and accumulate the squared ADC samples within an accumulated value during an RMS time window (see operation 240). In some embodiments, the processing logic accepts the ADC samples during a particular time period such as an entire period or a fraction of the entire period of a waveform the AC mains 104.

At operation 240, the processing logic determines whether the number of ADC samples that have been accumulated satisfy an RMS time window, e.g., where a certain number of samples would correlate to a particular RMS time window. Thus, satisfying the RMS time window can be understood as a combination of the ADC samples being greater than or equal to the RMS time window. If not satisfied, then at operation 245, the processing logic waits for the ADC 114 to complete the next scan before continuing to perform operation 235 on additional samples. If yes at operation 240, e.g., the RMS time window has been satisfied, then at operation 250, the processing logic calculates a square root of the accumulated value to generate the RMS value.

At operation 255, the processing logic determines whether the RMS value satisfies a threshold trip value, which can be pre-configured into the GFCI logic 121 for example. If not yet satisfied, at operation 260, the processing logic determines whether a maximum time has elapsed but the RMS value still remains below a minimum threshold value, e.g., which is smaller than the threshold trip value. If yes, then the converted voltage has not met requirements for tripping or RMS time window size adjustment, and the method flows back to operation 210.

If, however, at operation 260 the RMS value is greater than the minimum threshold value, at operation 265, the processing logic increases an RMS time window during which to trigger additional accumulation of ADC samples used in determining the RMS value. This increase can be a step-sized increase and can be performed more than once as operations 240 through 265 are repeated. In embodiments, the RMS time window can thus be understood as an adaptive sample accumulation window, as referred to herein. In some embodiments, the ultimate RMS time window size is at least ten times larger than the minimum RMS time window size.

Accordingly, the method 200 flows from operation 265 back to operation 235 or 245, enabling additional ADC samples to be accumulated towards the larger RMS time window.

Enabling this selective adaptation of the RMS time window allows more samples to be accumulated for lower leakage currents and increases the noise rejection capability of the integrated circuit 101 (and in particular the RMS logic), leading to a more accurate RMS value being calculated. This increase in the RMS time window can also be understood as a trigger delay period, which can be determined via a lookup table for example, designed to delay triggering an disconnect as per FIG. 9 by way of example. The net effect of a more-accurate RMS value or trigger delay period is the ability to avoid causing false or nuisance trips.

Table 1 illustrates a correlation between leakage current, an equivalent RMS voltage output by the ADC 114 (e.g., Vrms_ADC), a number of measurement cycles the GFCI logic 121 requests, the number of samples in the adaptive RMS time window, and actual measurement time in milliseconds (ms), according to at least some exemplary embodiments.

TABLE 1

| Leakage Current | Vrms_ADC | #Measurement Cycles | #Samples in Adapt. RMS Window | Actual Measurement Time (ms) |
|---|---|---|---|---|
| 2.65E−02 | 1.7490 | 1 | 64 | 8.3333 |
| 2.00E−02 | 1.3200 | 2 | 128 | 16.6667 |
| 1.75E−02 | 1.1550 | 3 | 192 | 25.0000 |
| 1.50E−02 | 0.9900 | 5 | 320 | 41.6667 |
| 1.00E−02 | 0.6600 | 7 | 448 | 58.3333 |
| 6.00E−03 | 0.3960 | 10 | 640 | 83.3333 |

If, at operation 255, the RMS value satisfied the threshold trip value, the processing logic outputs a trip signal to the trip logic 130 to cause a disconnect of a current supplied to a load by the AC mains.

At operation 270, the trip logic 130 determines whether the voltage of AC mains is at an optimum value for tripping the fault switch. The timing of causing the trip is dependent on the type of fault switch 106, which can vary between a high-voltage switch having a solenoid or a low-voltage solid state switch that does not have a solenoid, as was discussed with reference to FIG. 1. If, at operation 270 the AC mains voltage is at the optimum value for the type of fault switch 106, then at operation 280, the trip logic 130 triggers the fault switch.

Figure 3:
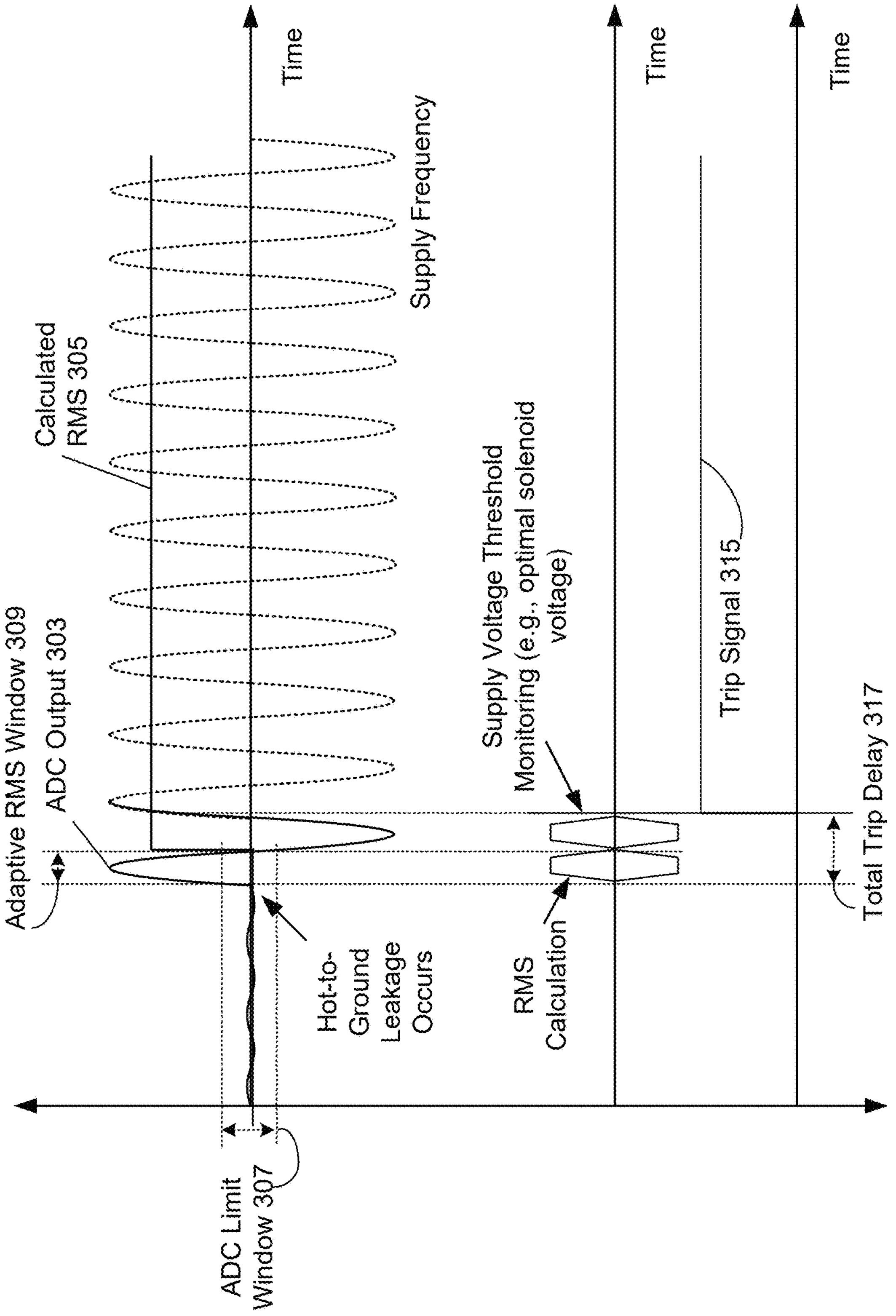
FIG. 3 is a set of waveforms illustrating the adaptive RMS accumulation window being triggered in response to sensing a relatively high leakage current according to some embodiments.

FIG. 3 is a set of waveforms illustrating the adaptive RMS accumulation window being triggered in response to sensing a relatively high leakage current according to some embodiments. The main waveform at the top is an ADC output 303, which can be monitored by the limit detection circuitry 115. At first, as can be seen, the ADC output 303 is well within an ADC limit window 307, so there RMS calculations by the control logic 116 are not triggered.

But, as the ADC output 303 spikes well above the ADC limit window 307, the RMS calculation is triggered (see middle waveform) during an adaptive RMS time window 309. If the leakage current is high enough, the ADC 114 and the control logic 116 generate a trip after a short, adaptive RMS time window 309. Thus, the length of the adaptive RMS time window 309 required to calculate the RMS value is relatively short (see the middle waveform) due to the strength of the ADC output spike, resulting in a short total trip delay 317 (see trip signal 315 in the bottom waveform). In embodiments, the supply voltage threshold monitoring (e.g., of an optimal solenoid voltage or a zero-voltage crossing) is performed immediately once the RMS value is available.

Figure 4:
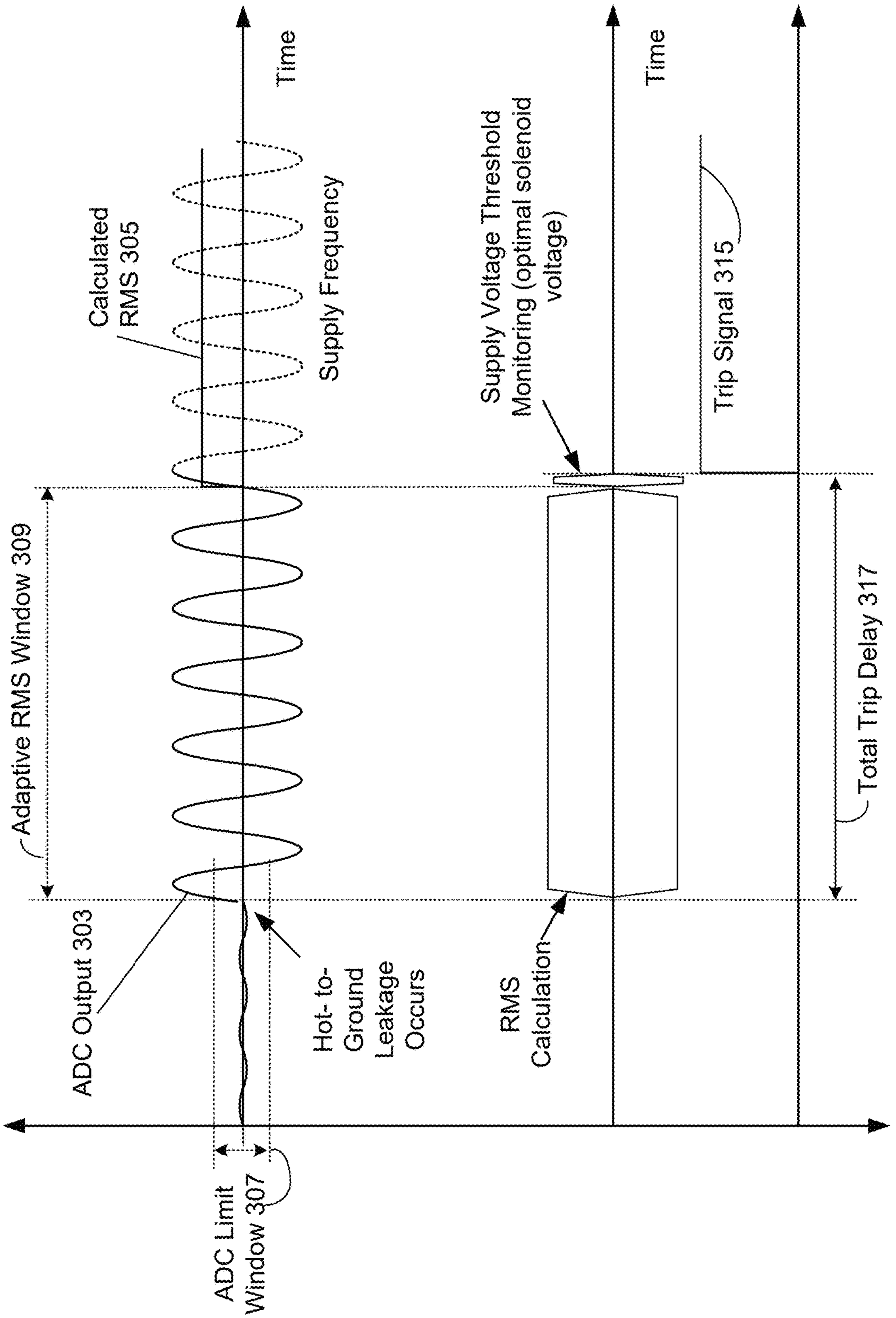
FIG. 4 is a set of waveforms illustrating the adaptive RMS accumulation window being triggered in response to sensing a relatively low leakage current according to some embodiments.

FIG. 4 is a set of waveforms illustrating the adaptive RMS accumulation window being triggered in response to sensing a relatively low leakage current according to some embodiments. This set of waveforms can be contrasted with those of FIG. 3 in that the ADC output 303 is lower, corresponding to a lower leakage current. This results in an increase in the length of the adaptive RMS time window, e.g., as a result of operations 255, 260, and 265 of the method 200 of FIG. 2. As a result of the longer RMS tome window, the RMS value calculation period takes longer, enabling the control logic to accumulate more ADC samples for high-noise immunity. As can be seen, the trip signal 315 is sent later after a longer total trip delay period 317.

Figure 5:
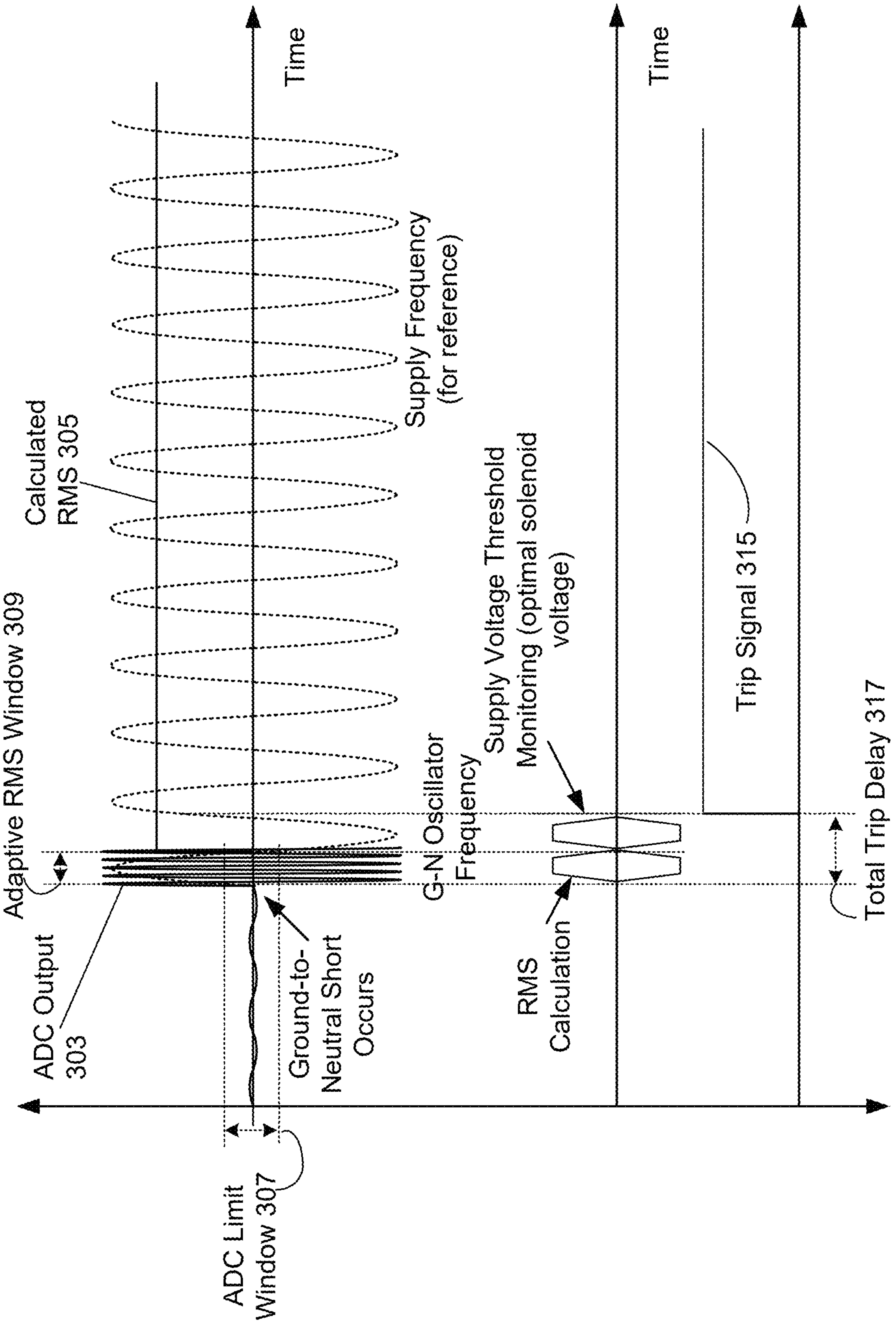
FIG. 5 is a set of waveforms illustrating the adaptive RMS accumulation window being triggered in response to sensing an oscillating current caused by a ground-to-neutral leakage current according to some embodiments.

FIG. 5 is a set of waveforms illustrating the adaptive RMS accumulation window being triggered in response to sensing an oscillating current caused by a ground-to-neutral (G/N) leakage current according to some embodiments. In some embodiments, as will be explained in more detail with reference to FIG. 9, the ground-to-neutral short causes an oscillator to begin transmitting through the N/G short sensor 103 (or coupling coil), which is coupled through the H/G current sensor 102 into the front-end circuitry 112. Despite the fact that the oscillation frequency is much higher than the frequency of the normal AC mains signal, the control logic 116 operates to calculate the RMS value independent of frequency. In embodiments, the adaptive RMS time window 309 is adjusted adaptively based on the oscillator voltage, which in turn depends on the G-N shorting impedance.

Figure 6:
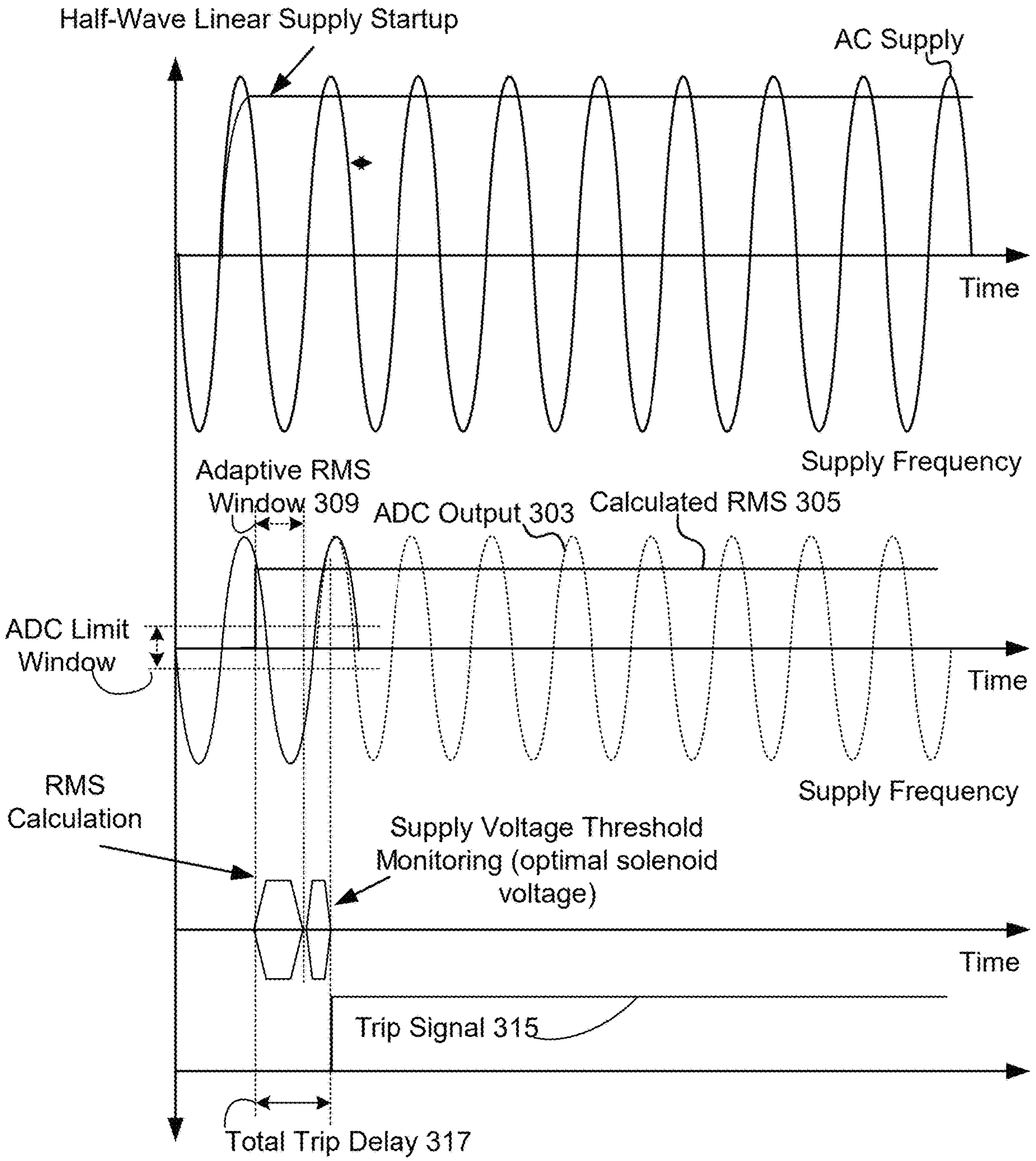
FIG. 6 is a set of waveforms illustrating how quickly the adaptive RMS accumulation window is triggered when sensing a current leakage at startup of the GFCI system according to some embodiments.

FIG. 6 is a set of waveforms illustrating how quickly the adaptive RMS accumulation window is triggered when sensing a current leakage at startup of the GFCI system 100 or device according to some embodiments. Many GFCI product, such as GFCI outlets, employ inexpensive half-wave linear power supplies that require some time to start up. Illustrated is the startup of the half-wave liner power supply and a corresponding AC supply that is generated. For high leakage currents, the trip should still happen fast, such as less in than 30 milliseconds. The power supply, however, may take half that time to startup. The disclosed monitoring of the ADC 114 and RMS value calculation and trip detections by the control logic 116 can occur quickly and accurately enough to trip within required time limits even in this scenario in which current leakage is present at start up.

Figure 7:
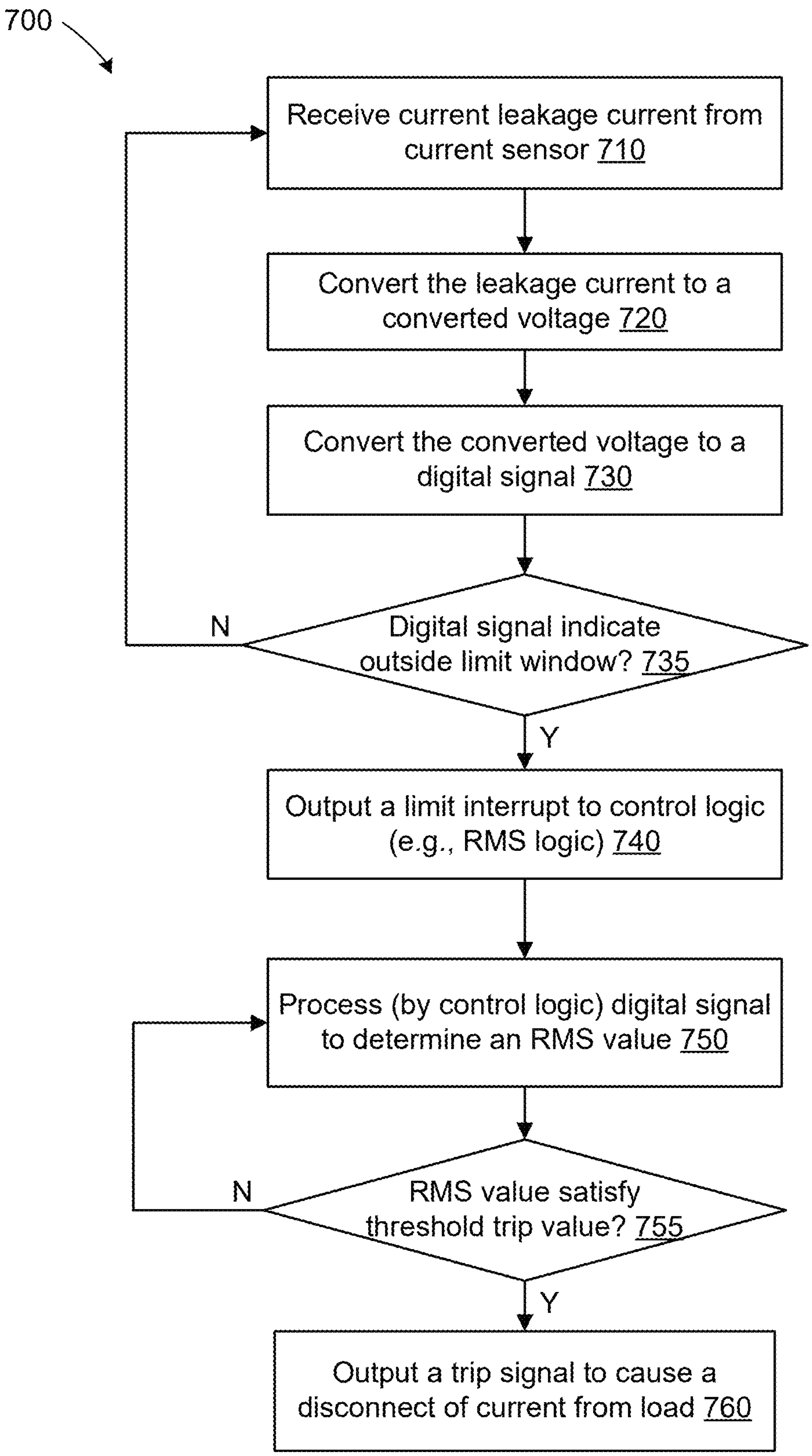
FIG. 7 is a flowchart illustrating a method of operating the GFCI circuit of FIG. 1 when detecting an H/G leakage current according to some embodiments.

FIG. 7 is a flowchart illustrating a method 700 of operating the GFCI circuit of FIG. 1 when detecting an H/G leakage current according to some embodiments. The method 400 can be performed by the integrated circuit 101 discussed with reference to FIG. 1 to include processing logic (such as the control logic 116) that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 710, the method 700 includes the front-end circuitry 112 receiving a H/G leakage current from the current sensor 102.

At operation 720, the method 700 includes converting, by the front-end circuitry, a leakage current to a converted voltage.

At operation 730, the method 700 includes converting, by the ADC 114, the converted voltage to a digital signal.

At operation 735, the method 700 includes determining, by the ADC 114, whether the digital signal indicates the threshold voltage is outside the limit window, e.g., is lower than a low threshold limit or is higher than a high threshold limit. If not, the method 700 loops back to operation 710.

At operation 740, the method 700 includes, in response to being outside the limit window at operation 735, outputting a limit interrupt to the control logic 116 (e.g., the RMS logic 120).

At operation 750, the method 700 includes processing, by the control logic 116, in response to receiving the limit interrupt, the digital signal to determine a root mean square (RMS) value.

At operation 755, the method 700 includes determining whether the RMS value satisfies a threshold trip value. If not, the method 700 loops back to operation 750.

At operation 760, the method 700 includes outputting, by the control logic 116 (e.g., the GFCI logic 121), a trip signal to cause a disconnect of current from the load in response to the RMS value satisfying the threshold trip value at operation 755.

Figure 8:
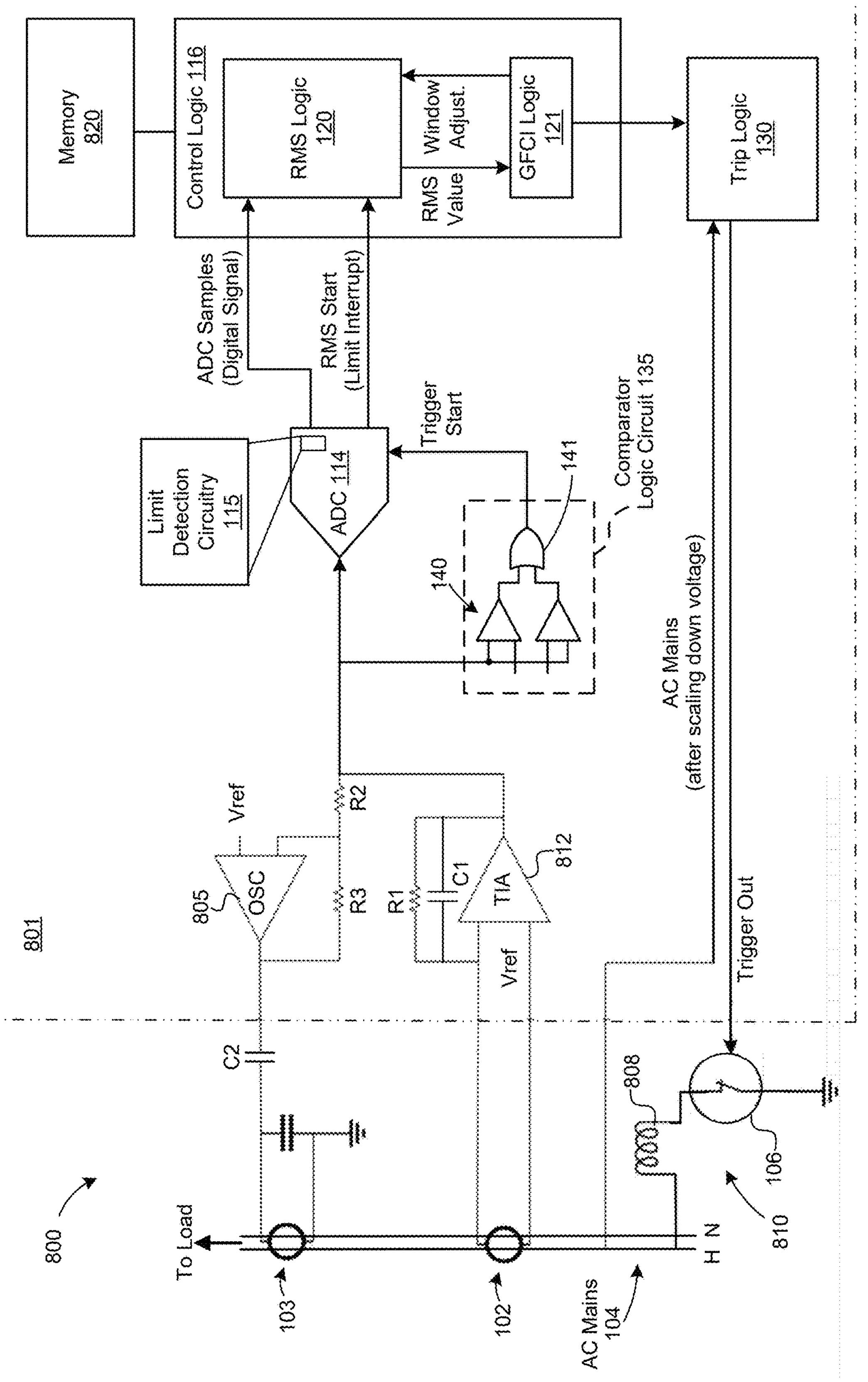
FIG. 8 is a schematic diagram of an example GFCI system in which sensing circuitry is implemented within an integrated circuit to detect a hot-to-ground (H/G) leakage current or a neutral-to-ground (N/G) leakage current, according to at least one embodiment.

FIG. 8 is a schematic diagram of an example GFCI system 800 in which sensing circuitry is implemented within an integrated circuit 801 to detect a hot-to-ground (H/G) leakage current or a neutral-to-ground (N/G) leakage current, according to at least one embodiment. In at least some embodiments, the GFCI system 800 (or device) is a specific example of the GFCI system 100 (or device) of FIG. 1. In some embodiments, the GFCI system 800 includes AC mains 104 having a hot line (H) and a neutral line (N) and an H/G sensing coil or the current sensor 102 coupled to the AC mains to detect leakage current.

In some embodiments, the GFCI system 800 further includes a fault assembly 810 that includes a fault switch 106, which is coupled to a ground, and a solenoid 808 (or relay) that is coupled between the hot line of the AC mains 104 and the fault switch 106. The fault switch 106 can energize the solenoid 108 to disconnect AC power from a load coupled to the AC mains 104. In some embodiments, the fault switch 106 is a silicon controlled rectifier (SCR) or other kind of fault switch.

In at least some embodiments, the integrated circuit 801 includes a transimpedance amplifier 812 coupled to the current sensor 102. For example, each of two terminals of the current sensor 102 can be coupled to a respective input terminal of the transimpedance amplifier. To scale the output voltage properly, the transimpedance amplifier 812 can include a resistor R1 coupled across a first input terminal and an output terminal, where a second input terminal receives a voltage reference signal. Additionally, a capacitor C1 is connected across R1 to form a low pass filter to mitigate any high frequency noise that may occur on the power line. In embodiments, converts a leakage current, received from the current sensor 102, to a converted voltage. The integrated circuit 801 can further include the ADC 114, coupled to the transimpedance amplifier 812, to convert the converted voltage to a digital signal, e.g., by sampling the converted voltage signal.

In various embodiments, the integrated circuit 801 further includes the control logic 116 coupled to the ADC 114 and which is configured to receive the digital signal. In embodiments, the control logic 116 processes the digital signal to determine an equivalent DC value associated with the converted voltage over time. In some embodiments, the average value is a root mean square (RMS), an average rectified value, or the like value of the digital signal calculated over time. Thus, the converted voltage may occur over a period of time or intermittently over time. The control logic 116 can further determine a trigger delay period corresponding to the equivalent DC value. The control logic 116 can further output, in response to the converted voltage still satisfying the equivalent DC value after waiting the trigger delay period, a trip signal to the trip logic 130 to cause a disconnect of a current supplied to a load by the AC mains 104. By causing a delay of a particular trigger delay period, the integrated circuit 101 can mitigate any noise transients or false events within the trigger time. In other words, the leakage current will need to be sustained for at least the trigger delay period in order to trigger the trip logic 130 to disconnect the load from the AC mains 104. In addition to delay trigger, the filtering effects of the RMS algorithm gives extra protection against false trips due to noise.

In some embodiments, a memory 820 is coupled to the control logic 116 to store a lookup table or LUT (or similar data structure capable of storing data or information) and historic RMS values (or other equivalent DC values). In embodiments, the LUT includes RMS values and corresponding trigger delay periods, e.g., indexed to the RMS values. Table 1 illustrates example RMS voltage values (Vrms_ADC), the corresponding trigger delay (e.g., as the actual measurement time), as well as an original sensed leakage current from the AC mains 104. Table 1 is exemplary only and a given LUT can include more, fewer, and/or different values than those displayed in Table 1. In some embodiments, any leakage current above 26.5 mA would have a trip delay of 8.3 ms.

In some embodiments, the control logic 116 calculates an RMS value as the equivalent DC value. The control logic 116 can access the LUT and determine, from the LUT, the trigger delay period based on the RMS value. The control logic 116 can then output the trigger signal after waiting the determined trigger delay period. In some embodiments, the control logic 116 can analyze the historical RMS values stored in the memory 820 to determine a historical RMS value to be compared against presently-measured RMS values from recent leakage current that is detected.

In some embodiments, the trip logic 130 is coupled to the fault switch 106 and to the AC mains 104. In embodiments, the trip logic 130 compares the current of the AC mains 104 to a minimum voltage during a positive half cycle of the current, e.g., the AC current from the AC mains 104. In embodiments, the minimum voltage is required to trip the solenoid 808 (or relay) coupled between the AC mains 104 and the fault switch 106. In embodiments, the trip logic 130 causes the fault switch 106 to close in response to the current exceeding the minimum threshold and in response to the trip signal. Once closed, the fault switch 106 applies a voltage to the solenoid 808 to energize the relay to disconnect the input AC line voltage (e.g., the voltage of the hot line of the AC mains 104) from the load.

In some embodiments, the integrated circuit 801 is a system on a chip (SoC) having on-board computing, e.g., in which the control logic 116 can be implemented with a microcontroller, a programmable processor, an ASIC, a field programmable gate-array (FPGA) device, a processing core, or the like. In embodiments, the memory 820 is volatile memory, non-volatile memory, or a combination of the volatile memory and non-volatile memory. Thus, the memory 820 can include memory storage that backs a cache in which is buffered the LUT and the historic RMS values, e.g., to enable fast access to buffered values during operation of the integrated circuit 801 (e.g., GFCI circuit).

In some embodiments, a neutral-to-ground (or N/G) leakage current can occur in the presence of a ground loop that electromagnetically couples the N/G short sensor 103 (e.g., coupling coil) to the current sensor 102. As illustrated, this N/G short sensor 103 can flow from the neutral line (N) of the AC mains 104, which passes through the coupled coils, and then through a coupled load to ground, thus forming the "ground loop."

In at least some embodiments, the system 800 can include an oscillator 805, e.g., which is a part of the front-end circuitry 112 (FIG. 1). In some embodiments, the oscillator 805 includes a first input terminal coupled to an output of the transimpedance amplifier 812 (e.g., via a second resistor, R2) and a second terminal that receives a reference voltage (Vref). A third resistor (R3) can be coupled between the first input terminal to an output terminal of the oscillator 805.

In some embodiments, an output of the oscillator 805 is coupled through a capacitor C2 to a first terminal of the N/G short sensor 103. A second terminal of the N/G short sensor 103 can be coupled to ground. In this way, when a ground loop is present, the ground loop causes the electromagnetic coupling of the N/G short sensor 103 and the H/G current sensor 102. In embodiments, the transimpedance amplifier 812, the oscillator 805, and the feed-through capacitor C2 together cause the oscillation to occur when the two coils are mutually coupled. For example, in some embodiments, the mutual coupling of the N/G short sensor 103 and the H/G current sensor 102 causes the transimpedance amplifier 812 to trigger the oscillator 805 to output an oscillating current to the AC mains 104 that can be used to detect a magnitude of the N/G leakage current. In some embodiments, the oscillator 805 produces the oscillating current at a frequency of at least two kilohertz. The transimpedance amplifier 812 can then convert the oscillating current, received from the AC mains 104, into an oscillating voltage, which is then fed to the ADC 114 for processing.

In some embodiments, the oscillator 805 is coupled to the N/G short sensor 103, which is coupled to AC mains 104 in the presence of a ground leakage. In embodiments, the oscillator 805 outputs an oscillating current to the AC mains 104 in response to presence of a ground loop that electromagnetically couples the N/G short sensor 103 to the current sensor 102, which is also coupled to the AC mains 104. The transimpedance amplifier 812 can be coupled between the H/G current sensor 102 and the oscillator 805. In embodiments, the transimpedance amplifier 812 triggers the oscillator 805 into operation and converts the oscillating current into an oscillating voltage.

In various embodiments, as discussed, the ADC 114 is coupled to the transimpedance amplifier 812 and is configured to convert the oscillating voltage into a digital signal. The control logic 116 can be coupled between the ADC 114 and the trip logic 130. In embodiments, the control logic 116 processes the digital signal to determine an equivalent DC value associated with the oscillating voltage over time. In some embodiments, the equivalent DC value is a root mean square (RMS), an average rectified value, or the like value of the digital signal calculated over time. Thus, the converted voltage may occur over a period of time or intermittently over time. In embodiments, the control logic 116 determines a trigger delay period corresponding to the equivalent DC value. The control logic can then output, in response to the oscillating voltage still satisfying the equivalent DC value after waiting the trigger delay period, a trip signal to trip logic to cause a disconnect of a current supplied to a load by the AC mains 104.

Figure 9:
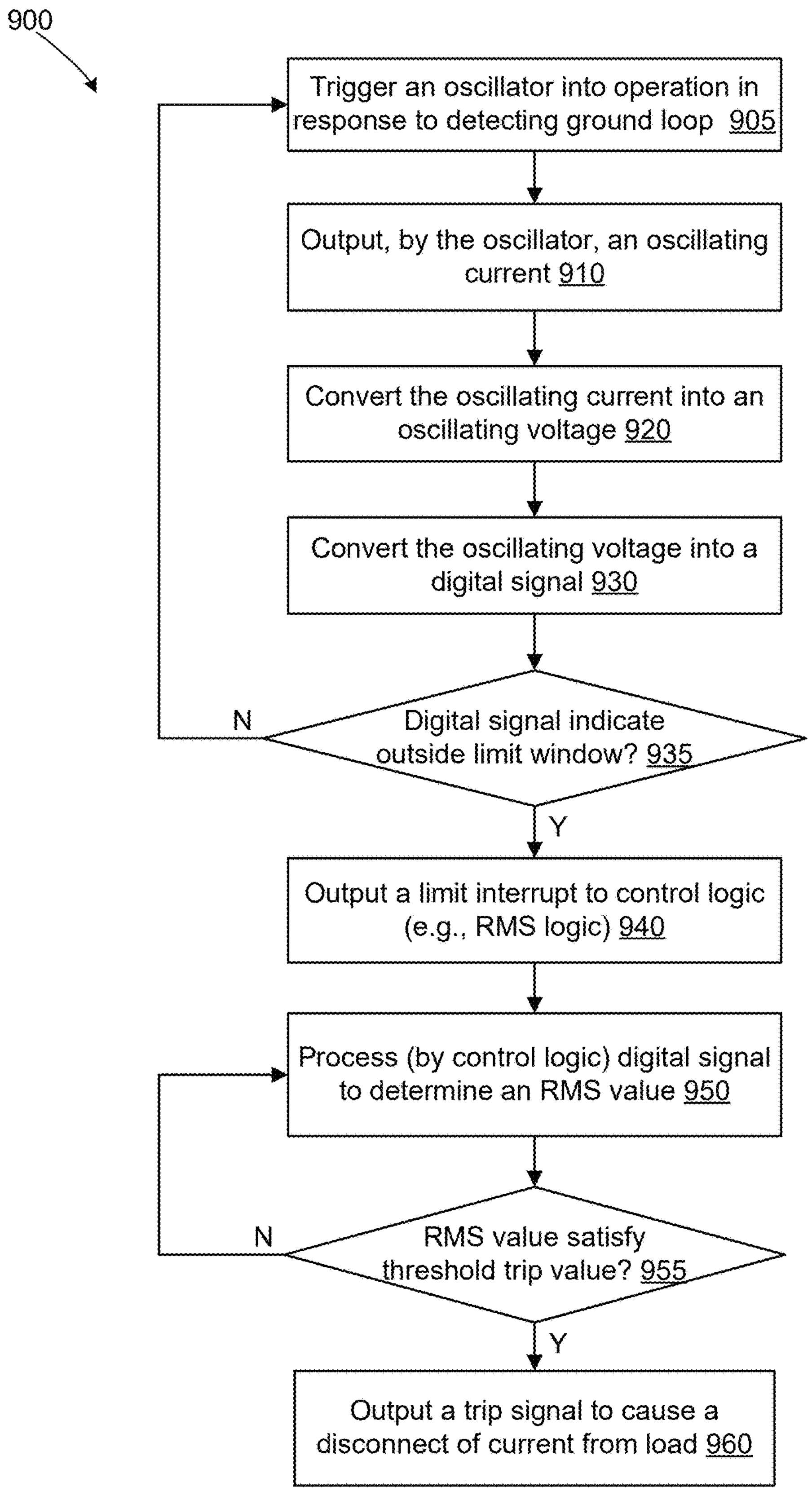
FIG. 9 is a flowchart illustrating a method of operating the GFCI circuit of FIG. 1 when detecting an N/G leakage current according to some embodiments.

FIG. 9 is a flowchart illustrating a method 900 of operating the GFCI circuit of FIG. 1 when detecting an N/G leakage current according to some embodiments. The method 900 can be performed by the integrated circuit 801 discussed with reference to FIG. 8 to include processing logic (such as the control logic 116) that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 905, the method 900 includes triggering the oscillator 805 into operation in response to detecting a ground loop.

At operation 910, the method 900 includes outputting, by the oscillator 805, an oscillating current.

At operation 920, the method 900 includes converting, by the transimpedance amplifier 8112, the oscillating current into an oscillating voltage.

At operation 930, the method 900 includes converting, by the ADC 114, the oscillating voltage into a digital signal.

At operation 935, the method 900 includes determining, by the ADC 114, whether the digital signal indicates the threshold voltage is outside the limit window, e.g., is lower than a low threshold limit or is higher than a high threshold limit. If not, the method 900 loops back to operation 905.

At operation 940, the method 900 includes, in response to being outside the limit window at operation 935, outputting a limit interrupt to the control logic 116 (e.g., the RMS logic 120).

At operation 950, the method 900 includes processing, by the control logic 116, in response to receiving the limit interrupt, the digital signal to determine a root mean square (RMS) value.

At operation 955, the method 900 includes determining whether the RMS value satisfies a threshold trip value. If not, the method 900 loops back to operation 950.

At operation 960, the method 900 includes outputting, by the control logic 116 (e.g., the GFCI logic 121), a trip signal to cause a disconnect of current from the load in response to the RMS value satisfying the threshold trip value at operation 955.

Various embodiments of integrating ground fault detection and interruption with a variable delay to AC power disconnection described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for GFCI-related architectures described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An integrated circuit comprising:

a front-end circuitry coupled to a current sensor, wherein the current sensor is coupled to alternating current (AC)

mains, and wherein the front-end circuitry is to convert a leakage current, received from the current sensor, to a converted voltage;

an analog-to-digital converter (ADC), coupled to the front-end circuitry, to convert the converted voltage to a digital signal, wherein the ADC comprises limit detection circuitry to:

detect the digital signal indicating the converted voltage is lower than a low threshold limit or higher than a high threshold limit; and output a limit interrupt in response to the detection; and control logic coupled to an output of the ADC, wherein the control logic is to:

process, in response to receiving the limit interrupt, the digital signal to determine a root mean square (RMS) value; and output a trip signal to trip logic to cause a disconnect of a current supplied to a load by the AC mains in response to the RMS value satisfying a threshold trip value.

2. The integrated circuit of claim 1, wherein, in response to the limit interrupt, the control logic is further to:

begin accepting ADC samples, from the ADC, within the digital signal;

calculate a square of each ADC sample;

accumulate the squared ADC samples within an accumulated value during an RMS time window; and calculate a square root of the accumulated value to generate the RMS value.

3. The integrated circuit of claim 2, wherein the control logic is further to:

remain inactive while not receiving the limit interrupt; and accept the ADC samples during a particular time period comprising an entire period or a fraction of the entire period of a waveform the AC mains.

4. The integrated circuit of claim 2, wherein the ADC is further to:

generate the ADC samples;

return to an inactive state in between generating each ADC sample; and continue generating the ADC samples for a fixed period of time based on a frequency of a waveform of the AC mains.

5. The integrated circuit of claim 1, further comprising a comparator logic circuit coupled between the front-end circuitry and the ADC, wherein the comparator logic circuit is to trigger a start of the ADC in response to detecting that the converted voltage satisfies a threshold value.

6. The integrated circuit of claim 1, wherein, in response to the RMS value not satisfying the threshold trip value yet satisfying a minimum threshold value that is smaller than the threshold trip value, the control logic is further to increase an RMS time window during which to trigger additional accumulation of ADC samples used in determining the RMS value.

7. The integrated circuit of claim 1, wherein the trip logic is coupled to a fault switch and to the AC mains, the trip logic to:

compare the current of the AC mains to a minimum voltage during a positive half cycle of the current, wherein the minimum voltage is required to trip a solenoid coupled between the AC mains and the fault switch; and cause the fault switch to close in response to the current exceeding the minimum voltage and in response to the trip signal.

8. The integrated circuit of claim 1, wherein the trip logic is coupled to a solid state switch and to the AC mains, the trip logic to:

detect a zero current crossing of the current of the AC mains; and cause the solid state switch to open in response to detecting the zero current crossing.

9. An integrated circuit comprising:

an oscillator, coupled to a neutral to ground (N/G) coupling coil, which is coupled to alternating current (AC) mains, wherein the oscillator is to output an oscillating current to the AC mains in response to presence of a ground loop that electromagnetically couples the N/G coupling coil to a current sensor, which is also coupled to the AC mains;

a front-end circuitry coupled between the current sensor and the oscillator, wherein the front-end circuitry is to trigger the oscillator into operation and convert the oscillating current into an oscillating voltage;

an analog-to-digital converter (ADC), coupled to the front-end circuitry, to convert the oscillating voltage to a digital signal, wherein the ADC comprises limit detection circuitry to:

detect the digital signal indicating the oscillating voltage is lower than a low threshold limit or higher than a high threshold limit; and output a limit interrupt in response to the detection; and control logic coupled to an output of the ADC, wherein the control logic is to:

process, in response to receiving the limit interrupt, the digital signal to determine a root mean square (RMS) value; and output a trip signal to trip logic to cause a disconnect of a current supplied to a load by the AC mains in response to the RMS value satisfying a threshold trip value.

10. The integrated circuit of claim 9, wherein, in response to the limit interrupt, the control logic is further to:

begin accepting ADC samples, from the ADC, within the digital signal;

calculate a square of each ADC sample;

accumulate the squared ADC samples within an accumulated value during an RMS time window; and calculate a square root of the accumulated value to generate the RMS value.

11. The integrated circuit of claim 10, wherein the control logic is further to:

remain inactive while not receiving the limit interrupt; and accept the ADC samples during a particular time period comprising an entire period or a fraction of the entire period of a waveform the AC mains.

12. The integrated circuit of claim 10, wherein the ADC is further to:

generate the ADC samples;

return to an inactive state in between generating each ADC sample; and continue generating the ADC samples for a fixed period of time based on a frequency of a waveform of the AC mains.

13. The integrated circuit of claim 9, further comprising a comparator logic circuit coupled between the front-end circuitry and the ADC, wherein the comparator logic circuit is to trigger a start of the ADC in response to detecting that the oscillating voltage satisfies a threshold value.

14. The integrated circuit of claim 9, wherein, in response to the RMS value not satisfying the threshold trip value yet satisfying a minimum threshold value that is smaller than the threshold trip value, the control logic is further to increase an RMS time window during which to trigger additional accumulation of ADC samples used in determining the RMS value.

15. A method of operating a ground fault circuit interrupter (GFCI) circuit, the GFCI circuit comprising a front-end circuitry coupled to a current sensor, the current sensor coupled to alternating current (AC) mains, an analog-to-digital converter (ADC) coupled to the front-end circuitry, a control logic coupled to the ADC and to trip logic, wherein the method of operating the GFCI circuit comprises:

converting, by the front-end circuitry, a leakage current receive from the current sensor to a converted voltage;

converting, by the ADC, the converted voltage to a digital signal;

outputting, by the ADC, a limit interrupt responsive to the digital signal indicating the converted voltage is lower than a low threshold limit or higher than a high threshold limit;

processing, in response to receiving the limit interrupt, by the control logic, the digital signal to determine a root mean square (RMS) value; and outputting, by the control logic to trip logic, a trip signal to cause a disconnect of a current supplied to a load by the AC mains in response to the RMS value satisfying a threshold trip value.

16. The method of claim 15, wherein, in response to the limit interrupt, the method further comprising:

beginning to accept, by the control logic, ADC samples, from the ADC, within the digital signal;

calculating a square of each ADC sample;

accumulating the squared ADC samples within an accumulated value during an RMS time window; and calculating a square root of the accumulated value to generate the RMS value.

17. The method of claim 16, further comprising:

remaining, by the control logic, inactive while not receiving the limit interrupt; and accepting, by the control logic, the ADC samples during a particular time period comprising an entire period or a fraction of the entire period of a waveform the AC mains.

18. The method of claim 16, further comprising:

generating, by the ADC, the ADC samples;

returning to an inactive state in between generating each ADC sample; and continuing generating the ADC samples for a fixed period of time based on a frequency of a waveform of the AC mains.

19. The method of claim 16, wherein the GFCI circuit further comprises a comparator logic circuit coupled between the front-end circuitry and the ADC, the method further comprising triggering, by the comparator logic circuit, a start of the ADC in response to detecting that the converted voltage satisfies a threshold value.

20. The method of claim 15, further comprising, in response to the RMS value not satisfying the threshold trip value yet satisfying a minimum threshold value that is smaller than the threshold trip value, increasing, by the control logic, an RMS time window during which to trigger additional accumulation of ADC samples used in determining the RMS value.

* * * * *